(12) United States Patent
Pino et al.

(10) Patent No.: US 8,274,312 B2
(45) Date of Patent: Sep. 25, 2012

(54) SELF-RECONFIGURABLE MEMRISTOR-BASED ANALOG RESONANT COMPUTER

(75) Inventors: Robinson E. Pino, Rome, NY (US); James W. Bohl, Rome, NY (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 13/134,482

(22) Filed: Jun. 3, 2011

(65) Prior Publication Data
US 2012/0217994 A1 Aug. 30, 2012

Related U.S. Application Data

(60) Provisional application No. 61/463,952, filed on Feb. 25, 2011.

(51) Int. Cl.
*H03K 19/20* (2006.01)
(52) U.S. Cl. .......................................... 326/104; 326/38
(58) Field of Classification Search ........... 326/104–135
See application file for complete search history.

(56) References Cited

U.S. PATENT DOCUMENTS

| 7,511,532 B2* | 3/2009 | Derharcobian et al. ......... 326/41 |
| 7,719,881 B2* | 5/2010 | Bangert ........................ 365/158 |
| 7,902,857 B1* | 3/2011 | Pino ................................ 326/14 |
| 7,969,769 B2* | 6/2011 | Lowrey .......................... 365/163 |
| 2006/0028247 A1* | 2/2006 | Hara et al. ..................... 326/104 |
| 2011/0106742 A1* | 5/2011 | Pino ................................ 706/33 |

\* cited by examiner

*Primary Examiner* — Shawki Ismail
*Assistant Examiner* — Jany Tran
(74) *Attorney, Agent, or Firm* — Joseph A. Mancini (57) ABSTRACT

An apparatus which provides a self-reconfigurable analog resonant computer employing a fixed electronic circuit schematic which performs computing logic operations (for example OR, AND, NOR, and XOR Boolean logic) without physical re-wiring and whose components only include passive circuit elements such as resistors, capacitors, inductors, and memristor devices. The computational logic self-reconfiguration process in the circuit takes place as training input signals, which are input causing the impedance state of the memristor device to change. Once the training process is completed, the circuit is probed to determine whether the desired logic operation has been programmed.

8 Claims, 11 Drawing Sheets

Figure 1

| Circuit parameter Name | Value | Memristor Model Parameter | | Value |
|---|---|---|---|---|
| L1 | 0.5 H | | Ron/Roff | $100/20\times10^3$ Ω |
| L2 | 0.5 H | M1 | Th/Tl | 40/-40 |
| C1 | $0.05\times10^{-6}$ F | | Kh/Kl | $30\times10^3/25\times10^3$ |
| C2 | $0.013\times10^{-6}$ F | | | |
| C3 | $0.017\times10^{-6}$ F | | | |
| R1 | 560 Ω | | Ron1/Roff | $24\times10^3/10\times10^4$ Ω |
| R2 | 560 Ω | M2 | Th/Tl | 2.05/-8.9 |
| R3 | $80\times10^3$ Ω | | Kh/Kl | $25\times10^3/15\times10^3$ |
| R4 | $60\times10^3$ Ω | | | |

| Initial Logic State | Final Logic State | Initial Memristor State (Ω) | Final Memristor State (Ω) |
|---|---|---|---|
| AND | NOR | M1/M2 = 1,539/25,001 | M1/M2 = 14,411/25,001 |
| NOR | XOR | M1/M2 = 1,500/25,001 | M1/M2 = 15,000/41,541 |
| XOR | OR | M1/M2 = 1,500/50,000 | M1/M2 = 1,612/50,000 |
| OR | AND | M1/M2 = 1,539/50,000 | M1/M2 = 1,539/26,417 |

SELF-RECONFIGURABLE MEMRISTOR-BASED ANALOG RESONANT COMPUTER

PRIORITY CLAIM UNDER 35 U.S.C. §119(e)

This patent application claims the priority benefit of the filing date of a provisional application Ser. No. 61/463,952, filed in the United States Patent and Trademark Office on Feb. 25, 2011.

STATEMENT OF GOVERNMENT INTEREST

The invention described herein may be manufactured and used by or for the Government for governmental purposes without the payment of any royalty thereon.

BACKGROUND OF THE INVENTION

This invention relates generally to the field of electronic circuit design. More specifically, this invention relates to electronic circuits which have a reprogrammable function. More specifically still, the present invention relates to reprogrammable electronic circuits which can function as reconfigurable computing circuits.

The basic electronic theory and operation of passive electronic circuit elements (inductor, resistor, and capacitor) are well understood in theory and practice [1]. Also, the memristor device electronic operation, model, and theory have been described in detail elsewhere [2][3]. From a functional point of view an electronic circuit composed of an inductor, capacitor, resistor, and memristor (LCRM) can be categorized as resonant circuit whose oscillating frequency can be determined theoretically in both time and frequency domains [1]. Given that the memristor device is essentially an electronic variable solid state resistor; the specific oscillating frequency of the resonant LCRM circuit can be made dependent on the impedance state variable M of the memristor device. [2][3]

What is lacking in the prior art, however, is an LCRM circuit into which an electronic signal can be input so as to change the oscillating frequency and magnitude of oscillation of the circuit based on the time-domain dynamic of the memristor device.

OBJECTS AND SUMMARY OF THE INVENTION

It is an object of the present invention to provide an apparatus that performs computing functions that are reprogrammable.

It is another object of the present invention, then, to provide an apparatus that performs computing functions that does not require power consumption to retain a programmed logic state or computing configuration.

It is yet another object of the present invention to provide an apparatus that serves as a fundamental building block for computing machine design that can be logically reconfigured repeatedly through the application of input signals while not requiring power consumption to retain any configured logical state.

Briefly stated, the present invention provides an apparatus which provides a self-reconfigurable analog resonant computer employing a fixed electronic circuit schematic which performs computing logic operations (for example OR, AND, NOR, and XOR Boolean logic) without physical re-wiring and whose components only include passive circuit elements such as resistors, capacitors, inductors, and memristor devices. The computational logic self-reconfiguration process in the circuit takes place as training input signals, which are input causing the impedance state of the memristor device to change. Once the training process is completed, the circuit is probed to determine whether the desired logic operation has been programmed.

The above, and other objects, features and advantages of the present invention will become apparent from the following description read in conjunction with the accompanying drawings, in which like reference numerals designate the same elements.

REFERENCES

A. Robbins and W. C. Miller, "Circuit Analysis: Theory & Practice," $2^{nd}$ Ed, *Delmar Cengage Learning*, New York, 2003.

R. Pino, J. Bohl, N. McDonald, B. Wysocki, P. Rozwood, K. Campbell, A. Oblea, and A. Timilsina, "Memristor Devices Compact Model Development for Neuromorphic Computing Applications", *IEEE/ACM International Symposium on Nanoscale Architectures, NANOARCH 2010*, Anaheim, Calif., Jun. 17-18, 2010.

L. Chua, "Memristor—The Missing Circuit Element," IEEE Transactions on Circuits Theory (IEEE), vol. 18, no. 5, 1971, pp. 507-519.

BRIEF DESCRIPTION OF THE DRAWINGS

FIG. 10 depicts the basic analog logic gate of the present invention self-reconfiguration process from Boolean logic XOR to OR.

FIG. 11 depicts the basic analog logic gate of the present invention self-reconfiguration process from Boolean logic OR to AND.

DETAILED DESCRIPTION OF THE PREFERRED EMBODIMENT

The present invention provides an apparatus and method for implementing a two port inductor, capacitor, resistor, memristor (LCRM) network that can be trained or conditioned to exhibit logic computing operations. An electronic input to the LCRM circuit will have the ability to change the oscillating frequency and magnitude of oscillation of the circuit based on the time-domain dynamic of the memristor device. The logic operations displayed by the LCRM circuit of the present invention are characterized by the peak oscillating voltage output. In particular, when the LCRM peak oscillating voltage output exceeds in magnitude a predetermined range, the output is characterized as a logic one output. On the other hand, when the output is lower than the predetermined threshold value, the output of the apparatus is considered a logic zero output.

Analog Logic Gate

Figure 1:
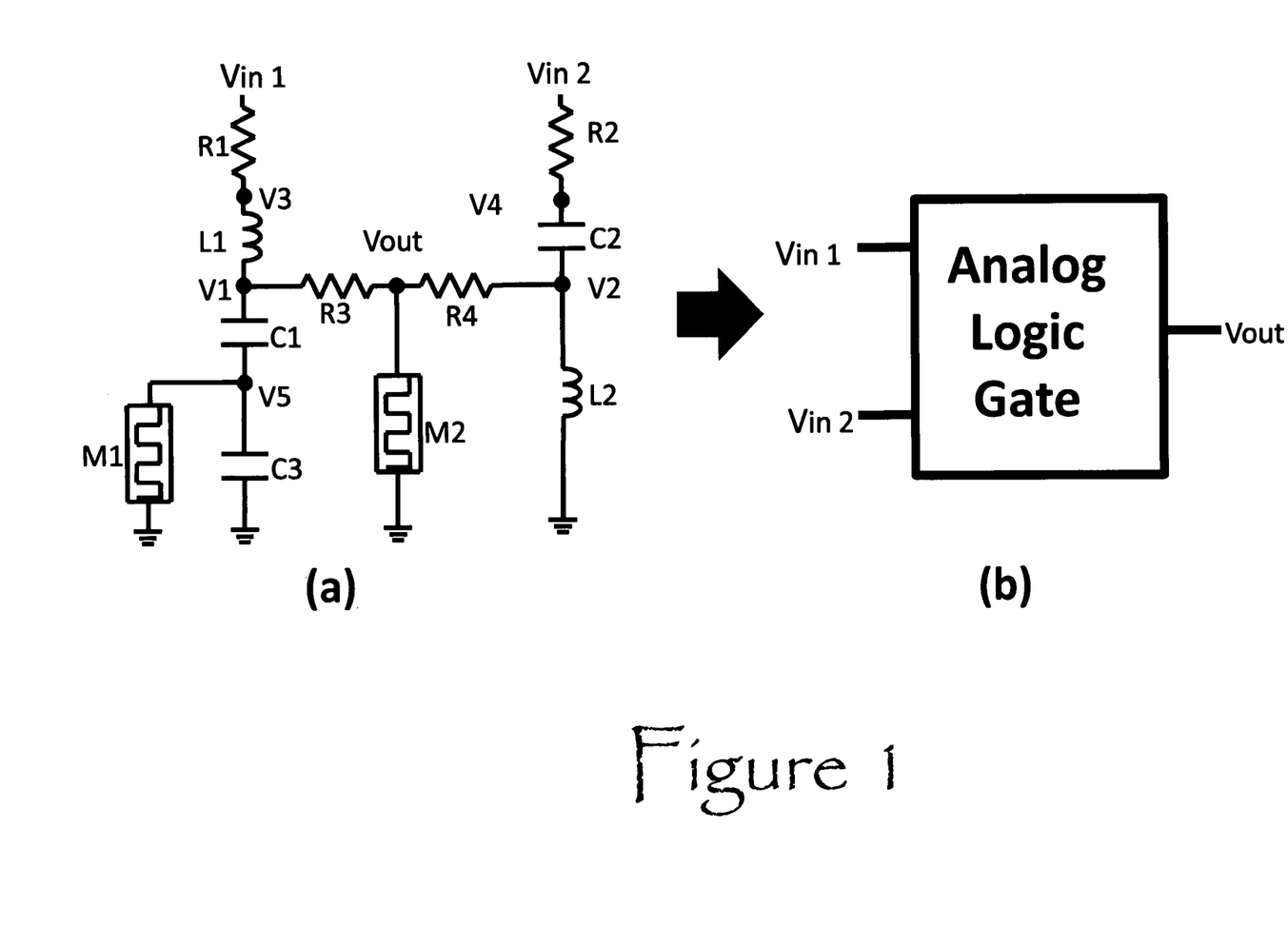
FIG. 1a depicts the electronic circuit schematic and configuration of the basic analog logic gate of the present invention.
FIG. 1b depicts the simplified logic block diagram of the basic analog logic gate of the present invention.

Referring to FIG. 1a and FIG. 1b, the present invention's basic components for a digital computing architecture are its logic building blocks. FIG. 1a depicts the electronic circuit schematic and configuration of the basic analog logic gate to enable the present invention's analog self-reconfigurable computer functionality. FIG. 1b depicts a simplified logic block diagram of the electronic circuit schematic depicted in FIG. 1a. Still referring to FIG. 1a and FIG. 1b, respectively, the schematic placement of all LCRM electronic components and the corresponding block diagram of the reconfigurable logic gate are apparent. The inputs to the logic gate are labeled Vin1 and Vin2, and the bias form of the inputs can be a discrete time variant input voltage pulses. The mathematical relationships governing the time domain dynamic behavior of the present invention's LRCM circuit schematic shown in FIG. 1a are given by Kirchhoff's current law and described in detail in equations (1) to (6) below.

$$0 = \frac{V_3 - V_{in1}}{R_1} + \frac{1}{L_1}\left(\int V_3 dt - \int V_1 dt\right) \quad (1)$$

$$0 = \frac{1}{L_1}\left(\int V_1 dt - \int V_3 dt\right) + \frac{V_1 - V_{out}}{R_3} + C_1\left(\frac{dV_1}{dt} - \frac{dV_5}{dt}\right) \quad (2)$$

$$0 = \frac{V_5}{M_1} + C_1\left(\frac{dV_5}{dt} - \frac{dV_1}{dt}\right) + C_3\frac{dV_5}{dt} \quad (3)$$

$$0 = \frac{V_{out} - V_1}{R_3} + \frac{V_{out} - V_2}{R_4} + \frac{V_{out}}{M_2} \quad (4)$$

$$0 = \frac{V_2 - V_{out}}{R_4} + \frac{1}{L_2}\int V_2 dt + C_2\left(\frac{dV_2}{dt} - \frac{dV_4}{dt}\right) \quad (5)$$

$$0 = \frac{V_4 - V_{in2}}{R_2} + C_2\left(\frac{dV_4}{dt} - \frac{dV_2}{dt}\right) \quad (6)$$

Figure 2:
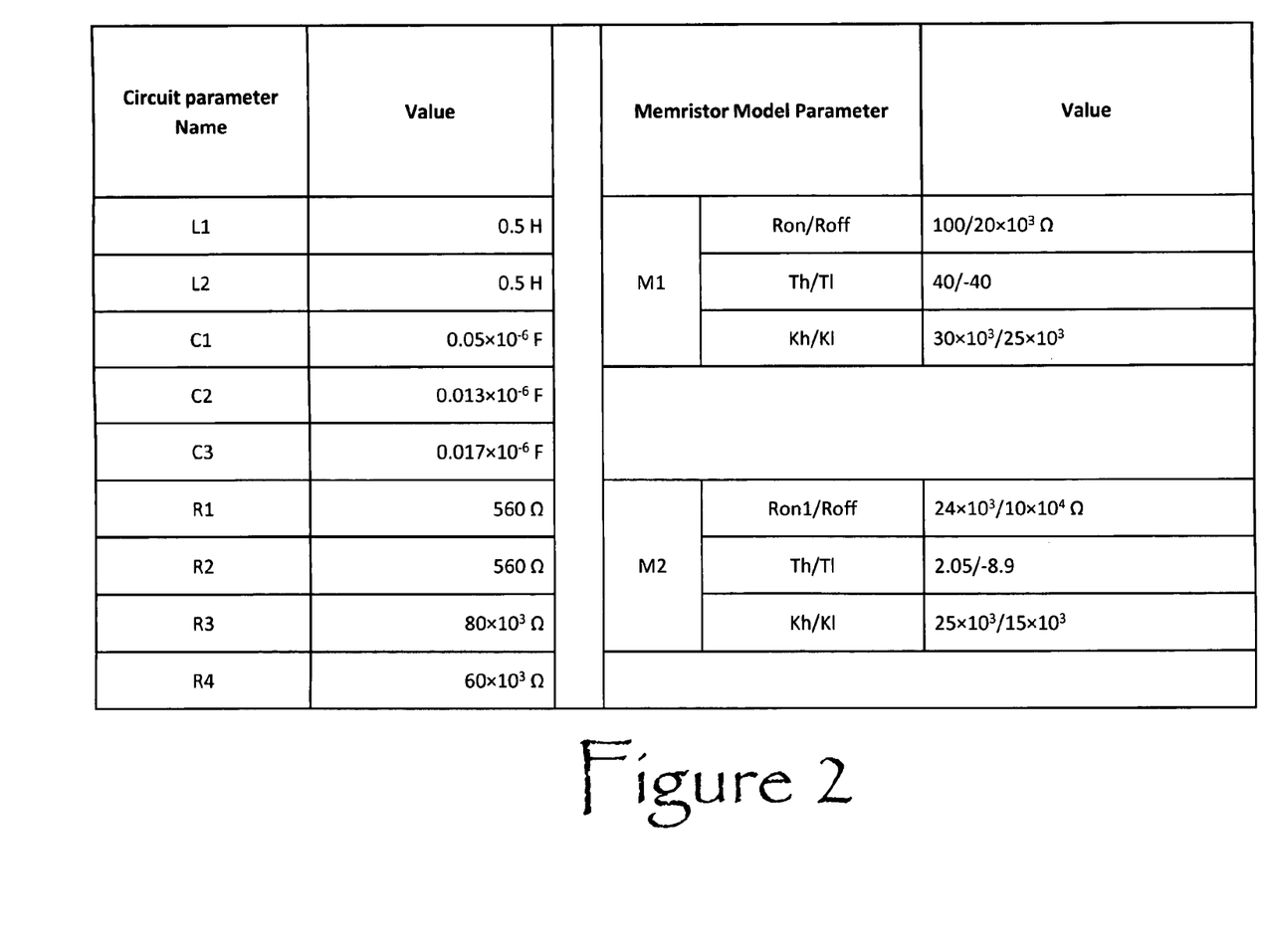
FIG. 2 depicts the circuit and memristor device models parameter values used to validate the performance of the reconfigurable logic gate operations.

The circuit and memristor device models parameter values used to validate the performance of the reconfigurable logic gate operations are shown in FIG. 2. The memristor device model operation and formalism is described elsewhere in the published literature [2].

Still referring to FIG. 1a and FIG. 1b, the circuit shown can be reconfigured to function as either an XOR gate, OR gate, AND gate, NOR gate, or the output can be turned off so it always outputs a zero. The circuit contains two memristor devices that can be switched to either a high or low resistance state to make the circuit perform the desired logic operation as shown. During normal operation, the input voltage to the gate representing the logic 1 bit is a 2 Volt amplitude positive half wave sinusoidal pulse at 1 KHz frequency. The output of the resonant logic gate is deemed high if it goes above the specified threshold voltage of 0.55 volts. During programming, pulses of a higher amplitude voltage of either positive or negative polarity are applied to the input nodes of the circuit, Vin1 and/or Vin2, to switch the memristors to the desired state.

Figure 3:
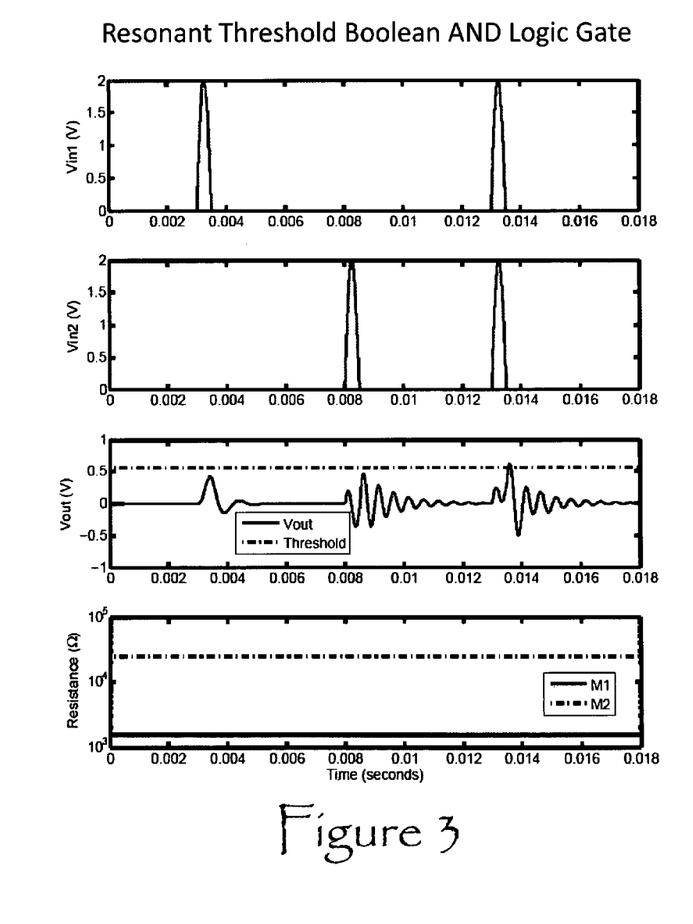
FIG. 3 depicts the time domain output response when the basic analog logic gate of the present invention is programmed to function as a Boolean AND logic gate.

Referring to FIG. 3 shows the time domain output response when the logic gate in FIG. 1a and FIG. 1b is programmed to function as a Boolean AND logic gate. FIG. 3 shows the input pulses Vin1 and Vin2 and the output response Vout. Still, from FIG. 3, it is apparent that the output, Vout, of the logic gate is higher than the specified threshold value of 0.55 Volts only when both inputs at input at the same time between the 12 and 14 ms of operation. The memristor state values that allow the circuit to exhibit the Boolean AND logic functionality are M1=1,539Ω and M2=25,001Ω respectively.

Figure 4:
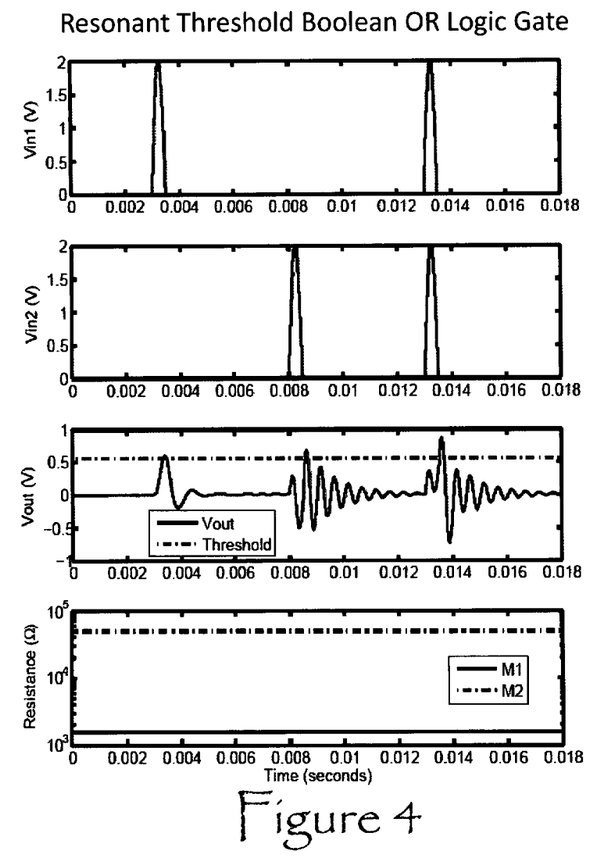
FIG. 4 depicts the time domain output response when the basic analog logic gate of the present invention is programmed to function as a Boolean OR logic gate.

Referring to FIG. 4 depicts the performance of the present invention when the logic circuit gate of FIG. 1a and FIG. 1b is programmed to behave as a Boolean OR logic gate, and, accordingly, the memristor values are programmed to M1=1,539Ω and M2=50,000Ω respectively. It is apparent in FIG. 4 that for any input to the resonant logic gate, the output is always above the specified 0.55 Volt threshold voltage.

Figure 5:
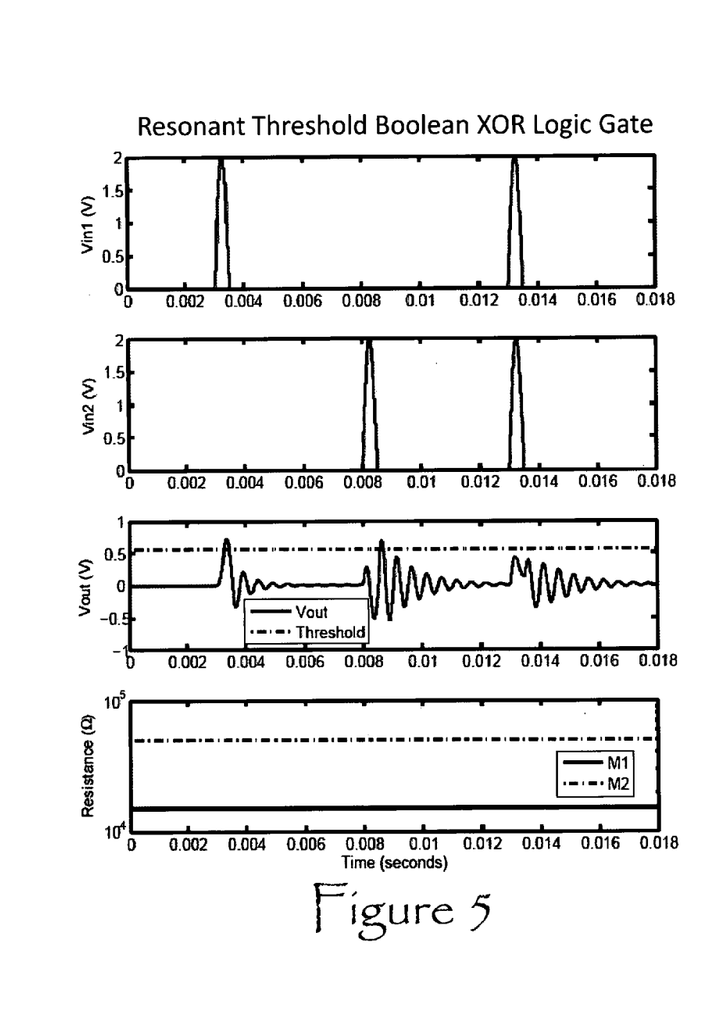
FIG. 5 depicts the time domain output response when the basic analog logic gate of the present invention is programmed to function as a Boolean XOR logic gate.

Referring to FIG. 5, when the memristor values are set to M1=1,500Ω and M2=50,000Ω respectively, the Boolean XOR logic operation can be performed. The Boolean XOR logic function states that the output is 1 whenever the inputs are different which is the case in FIG. 5 in which the output is below the threshold voltage only when both inputs, Vin1 and Vin2, are high, 2 Volts, between the 12 and 14 ms operation time.

Figure 6:
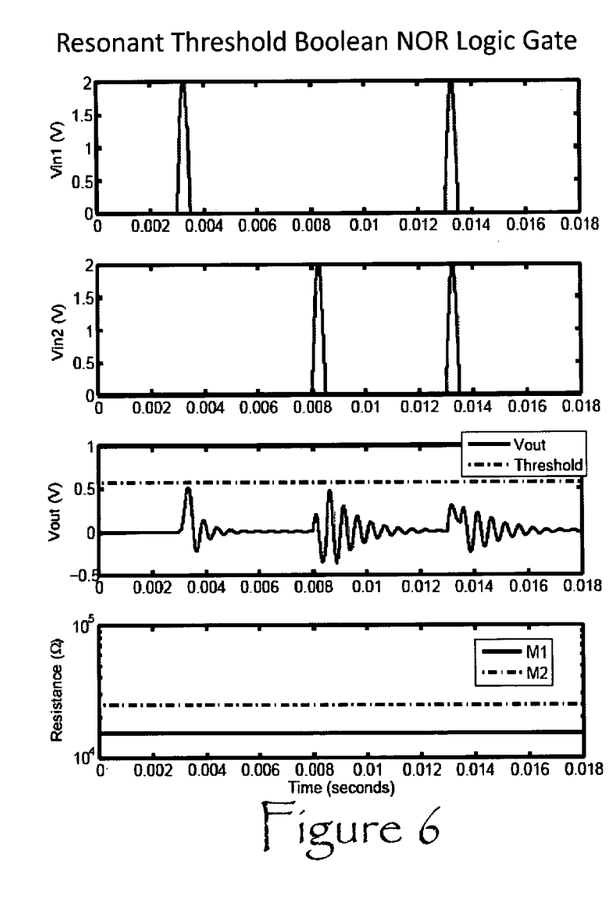
FIG. 6 depicts the time domain output response when the basic analog logic gate of the present invention is programmed to function as a Boolean NOR logic gate.

Referring to FIG. 6 shows the operations of the Boolean NOR logic function of the present invention when the memristor values are set to M1=1,500Ω and M2=25,001Ω respectively.

In the foregoing figures it was demonstrated how the present invention can reconfigure the logic gate to operate as various Boolean logic gates by setting the memristor devices M1 and M2 to specific impedance values. Additionally, however, the present invention can provide logic gate self-reconfiguration capability from a particular Boolean functionality to another and vice versa. To reprogram or reconfigure the logic gate, positive or negative programming pulses are applied to the inputs of the logic gate in a certain sequence to switch the state of one and/or both memristor devices, M1 and M2. The voltage of the programming pulses can range from −7.5 to 7.5 Volts approximately. These pulses are applied so that the voltage across the memristor to be switched exceeds the threshold voltage of the memristor and is of the correct polarity to make the memristor switch to the desired resistance state [2].

Referring to FIGS. 8, 9, 10, and 11 illustrates the logic gate self-reconfiguration process from Boolean logic AND to NOR (see FIG. 8), from NOR to XOR (see FIG. 9), from XOR to OR (see FIG. 10), and from OR to AND (see FIG. 11), respectively. The specific memristor device impedance state changes that allowed the logic gate to achieve self-reconfiguration are given in FIG. 7.

Figure 7:
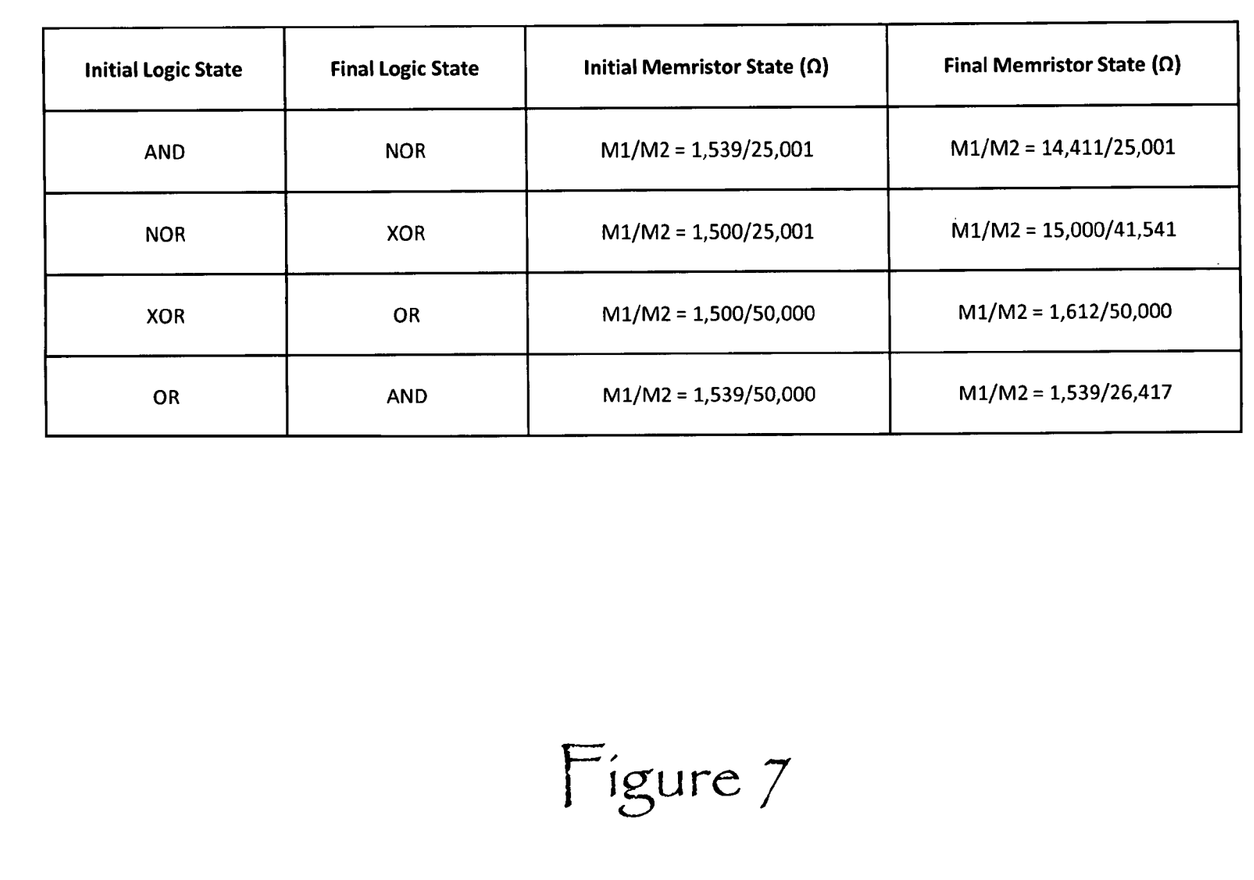
FIG. 7 depicts specific memristor device impedance state changes that allowed the logic gate to achieve self-reconfiguration.
Figure 8:
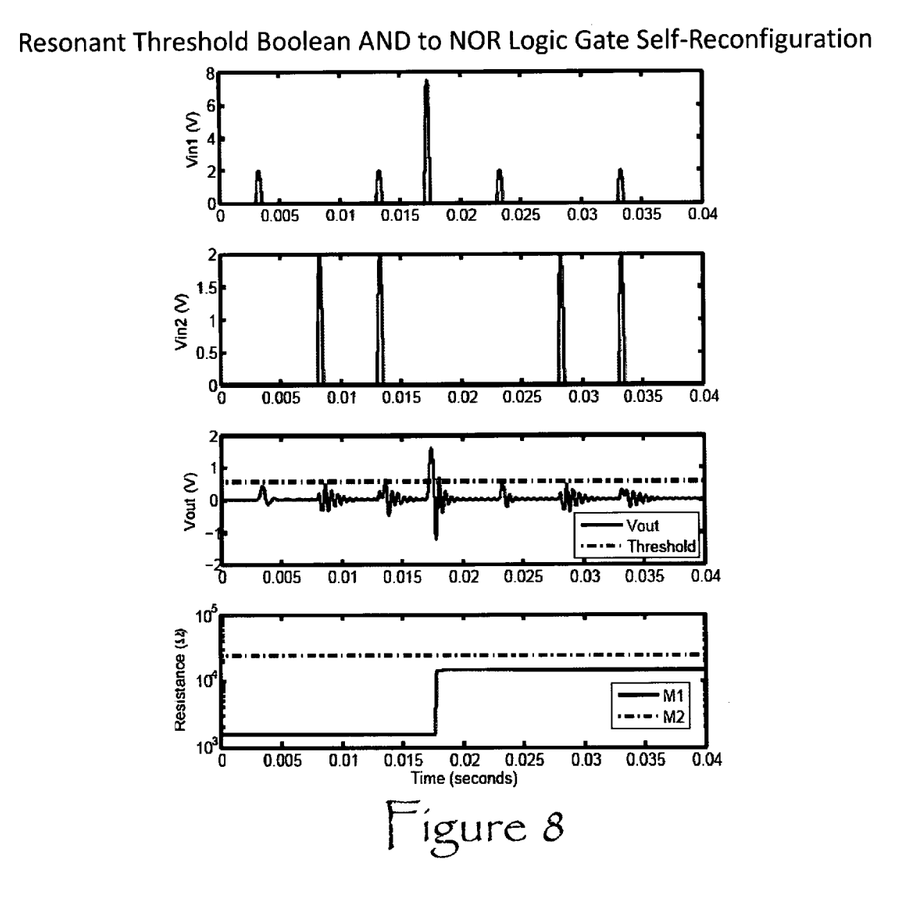
FIG. 8 depicts the basic analog logic gate of the present invention self-reconfiguration process from Boolean logic AND to NOR.
Figure 9:
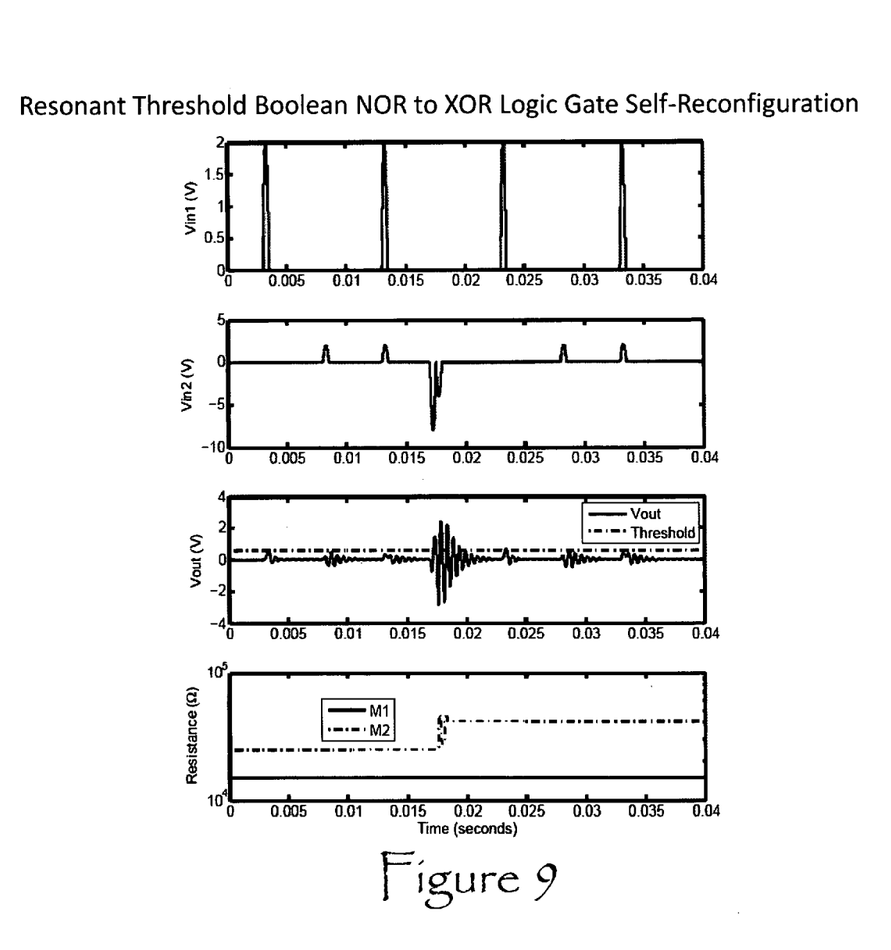
FIG. 9 depicts the basic analog logic gate of the present invention self-reconfiguration process from Boolean logic NOR to XOR.
Figure 10:
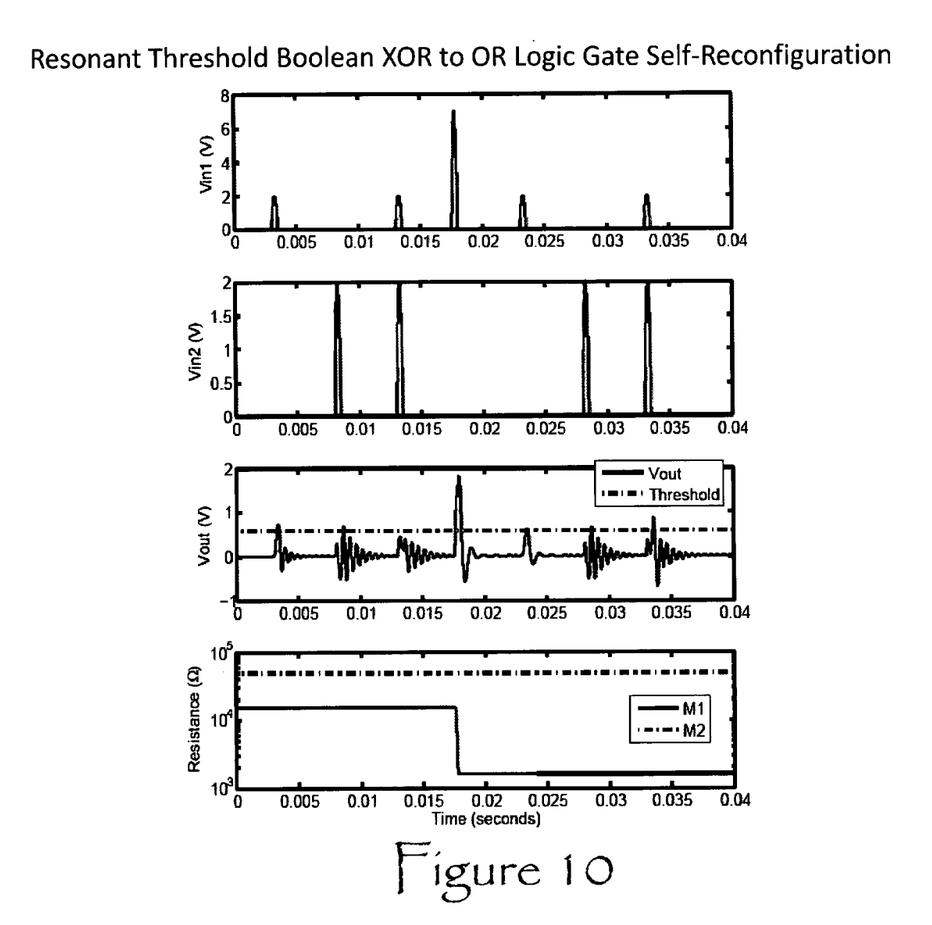
Figure 11:
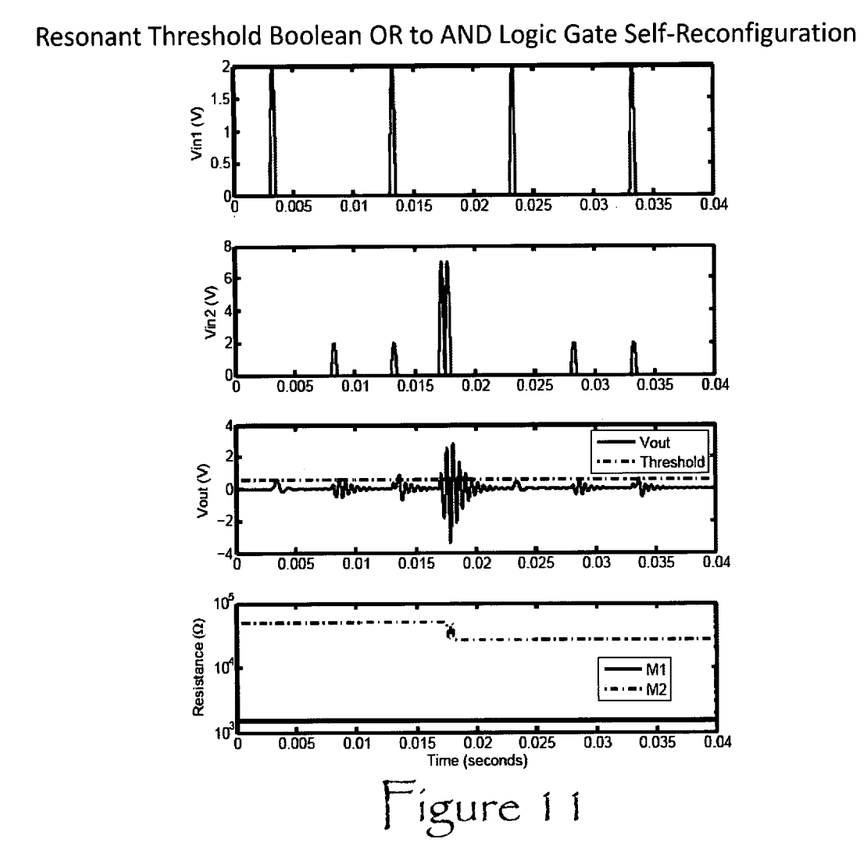

Referring to FIG. 8 illustrates that a single 7.5 Volt electrical pulse applied to node Vin1 is required to change the Boolean logic function from a AND to a NOR logic gate, and FIG. 7 illustrates that the memristor impedance values change, M1 change from 1,539 to 14,411Ω while M2 remained fixed at 25,001Ω. Similarly, the transitions to and from any other Boolean logic gate functionality can be described from the results in FIG. 9, FIG. 10, and FIG. 11 and the memristor initial/final impedance state values again given in FIG. 7. It is important to state that the experimental results described here represent only a small subset of the possible memristor impedance state combinations that would result in a particular Boolean logic gate functionality.

Thus to summarize, the present invention provides an apparatus and method for the design and operation characteristics of an analog self-reconfigurable Boolean logic computing architecture. The present invention's computing architecture leverages in a unique and novel way the non-linear dynamic properties of memristor devices with passive electronic components (inductor, capacitor, and resistor) to deliver threshold-based Boolean logic computational capabilities.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A reconfigurable electronic logic circuit, comprising:
a first input;
a second input
an output;
a voltage divider network comprising at least one programmable resistance; and
at least one resonant subcircuit;
wherein when voltage signals are input into either or both said first input and said second input, said electronic logic circuit will produce a resonant signal at said output which, when the peak voltage thereof exceeds a predetermined value, it is considered a logical "1", and considered a logical "0", otherwise, so as to perform a logic function on said input voltage signals.

2. The reconfigurable electronic logic circuit of claim 1, wherein said at least one programmable resistance comprises a memristor.

3. The reconfigurable electronic logic circuit of claim 1, wherein said at least one resonant subcircuit comprises an inductor-capacitor circuit.

4. The reconfigurable electronic logic circuit of claim 1, wherein said logic function can be reprogrammed to any one of AND, OR, NOR, or XOR logic functions.

5. The reconfigurable electronic logic circuit of claim 4, wherein said logic function is reconfigurable by switching the resistance state of said at least one memristors to another resistance state.

6. The reconfigurable electronic logic circuit of claim 5 wherein said memristor resistance state is switched by applying voltage pulses to either or both of said first and said second inputs wherein said voltage pulses are of a predetermined voltage, of a predetermined polarity, and applied in a predetermined sequence.

7. A reconfigurable computing circuit comprising the following circuit elements so arranged and interconnected:
a first signal input connected to a first terminal of a first resistance; a second terminal of said first resistance connected to a first terminal of a first inductance; a first terminal of a capacitance connected to a second terminal of said first inductance; a second terminal of said first capacitance connected to a first terminal of a first memrisistance; a second terminal of said first memresistance connected to a circuit ground; a first terminal of a second capacitance connected to said first terminal of said first memresistance and said second terminal of said first capacitance; a second terminal of said second capacitance connected to a circuit ground; a first terminal of a second resistance connected to said second terminal of said first inductance and said first terminal of said first capacitance; a second terminal of said second resistance connected to a first terminal of a second memresistance and a first terminal of a third resistance; a second terminal of said second memresistance connected to a circuit ground; a second terminal of said third resistance connected to a second terminal of a third capacitance, a first terminal of a second inductance, and a signal output; a first terminal of said third capacitance connected to a second signal input; and a second terminal of said second inductance connected to a circuit ground;
wherein, when voltage signals are input into either or both said first signal input and said second signal input, said electronic logic circuit will perform a logical operation on said voltage signals so as to produce a resonant signal at said signal output which, when the peak voltage thereof exceeds a predetermined value, it is considered a logical "1", and considered a logical "0", otherwise, so as to perform a logic function on said input voltage signals.

8. The reconfigurable computing circuit of claim 7 wherein said logical operation is capable of being reprogrammed by applying voltage pulses to either or both of said first and said second signal inputs wherein said voltage pulses are of a predetermined voltage, of a predetermined polarity, and applied in a predetermined sequence.

* * * * *